United States Patent
Dougherty et al.

(10) Patent No.: US 8,575,238 B2
(45) Date of Patent: Nov. 5, 2013

(54) X-RAY OPAQUE COATING

(71) Applicant: Raytheon Company, Waltham, MA (US)

(72) Inventors: Thomas K. Dougherty, Playa Del Ray, CA (US); Christopher T. Snively, McKinney, TX (US); Steven E. Lau, Harbor City, CA (US); William J. Wolfgong, Little Elm, TX (US); Cindy W. Ma, Union City, CA (US); Stephen L. Schrader, Murphy, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/691,075

(22) Filed: Nov. 30, 2012

(65) Prior Publication Data

US 2013/0165546 A1  Jun. 27, 2013

Related U.S. Application Data

(62) Division of application No. 12/620,001, filed on Nov. 17, 2009, now abandoned.

(60) Provisional application No. 61/115,389, filed on Nov. 17, 2008, provisional application No. 61/115,392, filed on Nov. 17, 2008, provisional application No. 61/119,170, filed on Dec. 2, 2008.

(51) Int. Cl.
 *C08G 59/06* (2006.01)
 *C08K 3/08* (2006.01)
 *C08K 3/10* (2006.01)
 *C08L 63/02* (2006.01)

(52) U.S. Cl.
 USPC ........... 523/458; 523/457; 523/459; 523/460; 525/523; 528/102

(58) Field of Classification Search
 None
 See application file for complete search history.

(56) References Cited

U.S. PATENT DOCUMENTS

| | | | | |
|---|---|---|---|---|
| 5,726,257 | A * | 3/1998 | Ueda et al. | ........... 525/508 |
| 2003/0030042 | A1 | 2/2003 | Sawada et al. | |
| 2006/0022860 | A1 | 2/2006 | Storvik et al. | |
| 2006/0255321 | A1 | 11/2006 | Baduvamanda et al. | |
| 2009/0042036 | A1 | 2/2009 | Kato | |

FOREIGN PATENT DOCUMENTS

| | | |
|---|---|---|
| DE | 3018748 A1 | 11/1981 |
| JP | 6331142 A | 11/1994 |
| JP | 2005272632 A | 10/2005 |
| WO | 0185214 A1 | 11/2001 |

OTHER PUBLICATIONS

Salinas-Castillo, A. et al., "Iodinated Molecularly Imprinted Polymer for Room Temperature Phosphorescence Optosensing of Fluoranthene," Chemical Communications, 2005, pp. 3224-3226.

Sui, Chen-En et al.: "Synthesis of 2,2-bis (4-hydroxy-3, 5-diiodophenyl) propane," XP002573389, retrieved from STN Database accession No. 1966: 11183 Abstract.

* cited by examiner

*Primary Examiner* — Robert Sellers
(74) *Attorney, Agent, or Firm* — Lando & Anastasi, LLP

(57) ABSTRACT

The disclosure relates to an X-ray opaque coating containing an epoxy resin including an iodinated phenol covalently bonded to a glycidyl ether. Iodinated phenol covalently bonded to a glycidyl ether may include iodinated bisphenol A, such as tetraiodobisphenol A, a glycidyl ether of mono-iodophenol, bis-iodephenol, tri-iodophenol, or combinations thereof. The coating may include an X-ray opaque inorganic filler. The disclosure also relates to an electronic component including a substrate and at last one device coupled to the substrate with an obfuscation layer disposed over the substrate for obscuring the device from an X-ray source. The obfuscation layer may include an X-ray opaque coating. The disclosure additionally relates to- a method of obscuring at least a portion of an electronic component by depositing an obfuscation layer that may include an X-ray opaque coating and a method of forming an X-ray opaque coating.

8 Claims, 1 Drawing Sheet

X-RAY OPAQUE COATING

PRIORITY CLAIM

The present application is a divisional application and claims priority under 35 U.S.C. § 121 to U.S. application Ser. No. 12/620,001, filed Nov. 17, 2009, titled "X-Ray Opaque Coatings", which claims priority under 35 U.S.C. § 119(e) to: U.S. Provisional Patent Application No. 61/115,389, filed Nov. 17, 2008, titled "X-Ray Opaque Coatings and Application,"; U.S. Provisional Patent Application No. 61/115,392, filed Nov. 17, 2008, titled "Glycidyl Ether of Di-Iodinated Phenol, a New Epoxy Diluent Useful for Formulation of X-Ray Opaque Coatings,"; and U.S. Provisional Patent Application No. 61/119,170, filed Dec. 2, 2008, titled "Highly Filled X-Ray Opaque Coating Materials Containing Iodinated Reactive Epoxy Diluent," each of which is incorporated by reference in their entirety for all purposes.

TECHNICAL FIELD

The current disclosure relates to an X-ray opaque coating, and in particular, an X-ray opaque coating containing an epoxy resin formed from an iodinated phenol containing a glycidyl ether. The current disclosure also relates to devices or materials containing such a coating and methods of forming such a coating.

BACKGROUND

Control of X-rays via X-ray opaque materials is useful in at least two situations: the protection of microelectronics and decreasing exposure of X-rays to humans and/or other animals. X-rays may damage many materials, such as microelectronics, as well as harm humans and other animals, particularly medical personnel who are frequently exposed to X-rays. Use of X-ray opaque materials may prevent or lessen these types of damages. For example. X-ray opaque materials may be used to prevent non-destructive investigation of hardware, such as microelectronics. This non-destructive investigation may be used to copy the hardware for commercial purposes or to discover confidential hardware designs and components.

Current techniques for protecting microelectronics from damaging X-rays, electromagnetic interference (EMI) and inhibiting examination and/or reverse engineering of components utilizes a multilayer coating including layers of resin, ceramic, metal or metal alloys, and/or an opaque porous silica-containing ceramic layer that is applied directly onto the microelectronics. However, the design and manufacture of these multi-coatings are both expensive and difficult. As a result, device manufacturers have limited the use of these protective coatings to a particular area of the microelectronics, this technique generally referred to as spot shielding, which only protects a portion of the device. In the event that damaging x-rays are present, or there is an EMI, device failures in areas that are not protected may cause the entire device to fail. Further, spot shielding may not protect the device from investigation or from reverse engineering tactics.

In the medical and dental field, X-ray opaque materials may be used to protect a subject (e.g., patient, technician, doctor, nurse, etc.) from errant X-ray penetration. The X-ray opaque materials may also be used for dental adhesives and fillers or bone adhesives, fillers, and/or substitutes, and may have properties that allow for proper imaging of the site of use. However, current X-ray opaque materials are limited in such uses because the components used to manufacture the opaque materials are required to have low toxicity and may benefit from other properties that are not easily obtained.

SUMMARY

According to a first embodiment, the disclosure relates to an X-ray opaque coating containing an epoxy resin formed from an iodinated phenol covalently bonded to a glycidyl ether.

According to a more particular embodiment, this iodinated phenol covalently bonded to a glycidyl ether may include iodinated bisphenol A. According to a more specific embodiment, the iodinated bisphenol A may include a diglycidyl ether of tetraiodobisphenol A.

According to another particular embodiment, the iodinated phenol covalently bonded to a glycidyl ether may include a glycidyl ether of mono-iodophenol, bis-iodophenol, tri-iodophenol, or combinations thereof. In a more particular embodiment, it may include a combination of two or more of these three compositions in which at least 50% of the total (e.g. by weight or concentration) is the glycidyl ether of bis-iodophenol.

According to an additional particular embodiment, the iodinated phenol covalently bonded to a glycidyl ether may include both a diglycidyl ether of tetraiodobisphenol A and a glycidyl ether of bis-iodophenol.

The above compositions, in some embodiments, may include an X-ray opaque inorganic filler.

According to a second embodiment, the disclosure relates to a method of forming an X-ray opaque coating, including any X-ray opaque coating described in the first embodiment above. The method may include forming an epoxy resin containing iodinated phenol covalently bonded to a glycidyl ether. The resin may be cured by combining the iodinated phenol covalently bonded to glycidyl ether and a curing agent. A diluent or an X-ray opaque inorganic filler may also be added.

According to a third embodiment, the disclosure relates to an electronic component including a substrate and at least one device coupled to the substrate with an obfuscation layer disposed over the substrate for obscuring the device from an X-ray source. The obfuscation layer may include an X-ray opaque coating, such as any X-ray opaque coating described in the first embodiment above. According to a more specific embodiment, the electronic component may also include at least one connection which may also be obscured by the X-ray opaque coating.

According to a fourth embodiment, the disclosure provides a method of obscuring at least a portion of an electronic component by depositing an obfuscation layer over a substrate of the electronic component to obscure at least one device coupled to the substrate from an X-ray source. The obfuscation layer may include an X-ray opaque coating, such as any X-ray opaque coating described in the first embodiment above. The obfuscation layer may be formed, for example as a sheet, prior to being deposited.

The above summary provides a general outline of particular embodiments of the invention. For a better understanding of the invention and its advantages, reference may be made to the following description of exemplary embodiments.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
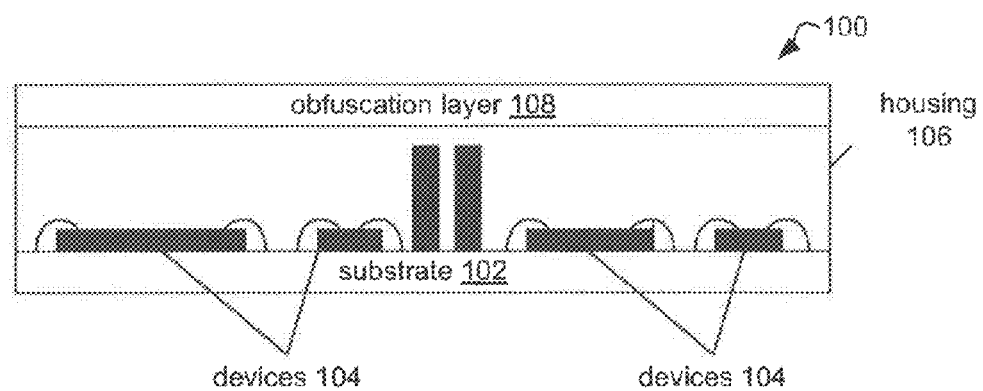
FIG. 1 illustrates an example cross-sectional view of an electronic component with an obfuscation layer, is accordance with embodiments of the present disclosure.
Figure 2:
FIG. 2 shows an example of the obfuscation layer obscuring features of an integrated circuit, in accordance with embodiments of the present disclosure.

Specific embodiments of the invention and their advantages are best understood by reference to FIGS. 1 and 2, wherein like numbers are used to indicate like and corresponding parts.

The present disclosure provides an X-ray opaque coating containing an epoxy resin formed from an iodinated phenol containing glycidyl ether as well as devices or materials including such a coating and methods of forming such a coating. According to some embodiments, the coating may also contain one or more X-ray opaque fillers. The epoxy resin may be a cured epoxy resin. The coating may be used to protect materials (e.g., microelectronics, hardware, etc.) and humans or animals from X-rays, and in particular, X-rays that may cause damage to the protected material, human or animal, or from X-rays that allow visualization of microelectronics hardware, electronic data storage devices, and other items. The coatings may also be used in medical and dental industries, for example as a shield to control diagnostic X-rays.

Referring to FIG. 1, a cross-sectional view of an electronic component 100 (e.g., circuit boards, chips, or other micro- or nanoelectronics) with an obfuscation layer 108 containing an X-ray opaque coating is shown, in accordance with embodiments of the present disclosure. Electronic component 100 may include active and/or passive devices 104 on top of a substrate 102. Devices 104 may be housed in housing 106 which includes an obfuscation layer 108. The epoxy resin may provide a robust material that is both thermally and chemically stable, while the use of fillers in the X-ray opaque coating may enhance the properties of the epoxy material.

When electronic component 100 is exposed to X-rays, some X-rays may be scattered, while most are absorbed by obfuscation layer 108. The obfuscation layer 108 may shield devices 104 from the X-rays which may damage the devices. In the same or alternative embodiments, obfuscation layer 108 may protect devices 104 from X-rays that may be used to reverse engineer or obtain information regarding devices 104.

Although shown here in FIG. 1 as a coating for protecting, shielding, or otherwise obscuring hardware components, obfuscation layer 108 may be used for other applications including, for example, the medical field, where obfuscation layer 108 may be used to protect: humans (e.g., nurses, X-ray technicians, patients, doctors) from errant X-ray exposure. In alternative embodiments, obfuscation layer 108 may be used as dental or bone adhesives, fillers, and/or substitutes.

In one embodiment, obfuscation layer 108 may include a diglycidyl ether of tetraiodobisphenol A (I):

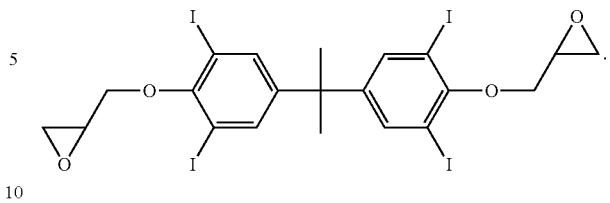

(I)

An example synthesis of the diglycidyl ether of teraiodobisphenol A (I): Is provided in Example 1 below.

In another embodiment, obfuscation layer 108 may include a glycidyl ether of bis-iodinated phenol (II), for example;

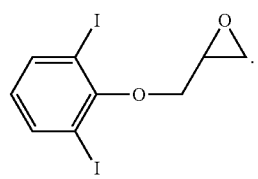

(II)

An example synthesis of this glycidyl ether of bis-iodinated phenol (II) is provided in Example 2 below. The glycidyl ether of mono-, bis-, or -tri-iodinated phenol and combinations thereof may have a lower viscosity than the diglycidyl ether of tetraiodobisphenol A (I). Although only one variant of the compound is shown above, various isomers may also be present. Further, although a bis-iodinated version is shown, mono- and tri-iodinated variants may also be used. According to one embodiment, a mixture of isomers of the glycidyl ether of mono-, bis- and tri-iodinated phenol may be used. In a more specific embodiment, the bis-iodinated form may be predominant (e.g. more than 50%, more than 90%, or between 50% and 90% of the total may be the bis-iodinated form). This form may offer more degrees of freedom and thus best enhance the processing window, final properties, and filler content of the final epoxy resin forming the X-ray opaque coating, According to a specific embodiment, the glycidyl ether of iodinated phenol may be used as a low viscosity diluent in combination with the diglycidyl ether of tetraiodobisphenol A (I).

According to additional embodiments, other compounds containing a covalently attached iodine and a glycidyl ether may be used. The compounds may be used alone or in combinations. Some may serve as diluents.

In some embodiments, obfuscation layer 108 may also contain one or more X-ray opaque inorganic fillers. These fillers may be included in the epoxy resin. Example fillers include, but are not limited to potassium iodide, bismuth iodide, barium chloride, barium iodide, barium sulfate, lead, lead iodide, lead acetate, lead oxide, gold flake and the like. Fillers may also enhance the thermal mechanical properties of obfuscation layer 108. According to one embodiment, the X-ray opaque coating may be highly filled, for example, it may include up to 85% filler by weight.

Epoxy resins in obfuscation layer 108 may be cured using any suitable curing techniques. Amine curing agents, such as triethylenetetraamine (TETA) and the like may be added. The amount of curing agent added may be determined by the stoichiometry of the curing agent and the resin(s).

In some embodiments, obfuscation layer 108 may vary in thickness across electronic component 100 depending on, for example, particular areas that need to be particularly protected, shielded, or otherwise need to be hidden from view. Random variations in the thickness of obfuscation layer 108 across electronic component 100 may also improve its X-ray opacity as compared to more uniform layers. In the same or alternative embodiments, obfuscation layer 108 may be have a uniform thickness across electronic component 100, where the thickness is suitable to protect, shield, or otherwise hide devices 104 or the connections (e.g., traces, vias, bond wires, etc.) between devices 104. In still other embodiments, obfuscation layer 108 may be thicker in areas where greater obfuscation is desirable. The overall size of the obfuscation layer may be sufficient, to obscure desired devices 104 or connections.

Although a single obfuscation layer is shown in FIG. 1, multiple layers may be used for the same electronic component 100. Further, although only a top obfuscation layer is shown, the layer may be placed on any surface and multiple surfaces may have obfuscation layers.

Obfuscation. layer 108 may be formed by one or more sheets of X-ray opaque coating. These individual sheets or the total thickness of X-ray opaque coating may be less than is required with current X-ray opaque coatings. For example, the X-ray opaque coating may be as thin as approximately 30-40 mil. Inclusion of a glycidyl ether of an iodinated phenol or other low-viscosity diluent may allow the use of less material overall to form an obfuscation layer.

Obfuscation layer 108 may be coupled to electronic component 100. According to some embodiments, obfuscation layer 108, devices 104, or both may be housed in a substantially or partially hermetic package such as, for example, a T/R module. In some embodiments the obfuscation layer 108 may be coupled to devices 104. In other embodiments, it may be spaced away from one or more devices 104. This may allow improvements in RF capabilities of electronic component 100.

Accordingly to specific embodiments, the X-ray blockage may be measured by luminance of the X-ray opaque coating. X-ray blockage may also be measured as compared to a baseline material, such as a phenol-based epoxy. In one example, X-ray blockage may be increased as much as 26% compared to uniodinated material of similar thickness. Addition of an iodinated diluent may increase X-ray blockage.

Certain X-ray opaque coatings of the current disclosure, particularly those containing a glycidyl ether of an iodinated phenol, may have a high refractive index. Such coatings may be useful for optical coating, refractive index matching materials, optical waveguides, and the like.

EXAMPLES

The present invention may be better understood through reference to the following examples. These examples are included to describe exemplary embodiments only and should not be interpreted to encompass the entire breadth of the invention.

Example 1

Formation of Diglycidyl Ether of A Tetraiodobisphenol A Molecule 33 grams (0.15 mol) of bisphenol A was dissolved in 1000 mL of aqueous ammonium hydroxide. A solution of 150 grains of potassium iodide, 100 grams of iodine (0.79 mol), and 800 ml, of water was added to the bisphenol A and aqueous ammonia hydroxide mixture over a period of an hour at room temperature. This caused a reaction in which the iodine disappears in the solution. The reaction was rapid, non-thermic and easy to control. The reaction was continued until an excess of iodine was colorimetrically evident.

Next, after 24 hours, an aqueous hydrochloric acid (HQ) was added to achieve a pH of 9 and the solid was vacuum filtered to yield a crude product. Next, the filtered solid was dissolved in aqueous ammonium hydroxide. Aqueous HCl was added to adjust the pH to 5. The precipitate was subsequently filtered and dried to yield 84 grams of product. The product had IR and Proton NMR spectra as well as elemental analysis results consistent with tetraiodobisphenol A (III);

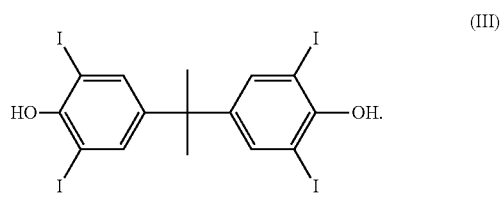 [SMILES: CC(C)(c1cc(I)c(O)c(I)c1)c1cc(I)c(O)c(I)c1]

60 grams of tetraiodophisphenol A (III) (0.16 mol) was mixed with a gross excess of 60 ml of epicholorohydrin and heated to 90° C. and stirred to dissolve the mixture to a homogenous solution. A solution of 8.9 grams of potassium hydroxide (0.16 mol) in 50 mL of methanol was added to the heated solution, over a period of 30 minutes. The resultant slurry was subsequently stirred and refluxed for an additional hour and cooled.

The cooled mixture was mixed with a mixture of chloroform and hexane and then filtered using a Celite filter pad. The filtered mixture was concentrated using heat and vacuum and yielded about 64 grams of viscous resin having a IR and Proton NMR as well as epoxy equivalent weight indicating that the diglycidyl ether of tetraiodobisphenol A (I) had been formed:

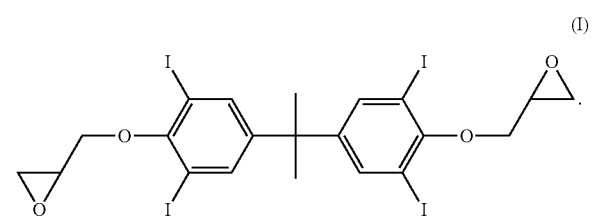 [SMILES: CC(C)(c1cc(I)c(OCC2CO2)c(I)c1)c1cc(I)c(OCC2CO2)c(I)c1]

Example 2

Formation of Glycidyl Ether of A Diiodinated Phenol Molecule 125 grams of phenol (1.33 mol) in two and a half liters of aqueous ammonium hydroxide was added to 400 grams of an aqueous mixture of potassium iodide and 335 grams of iodide (2.6 mol), which resulted in a rapid reaction that resulted in decolorization of the iodine mixture after addition of the phenol. A small aliquot of the reaction product was acidified and subjected to a gas chromatography/mass spectrometry (GC/MS) analysis, which showed the organic portion of the reaction mixture to be a mixture of single isomers of a mono- and/or tri-iodinated phenol and isomers of a bis-iodinated phenol. The remaining reaction product was adjusted to pH 6 with aqueous HCl and extracted with dichloromethane then dried over sodium sulfate. Distillation at reduced pressure yielded 350 grams of product that boiled at 75-90° C. at 1 Torr. This product was primarily bis-iodinated phenol (IV) with some mono-iodinated phenol:

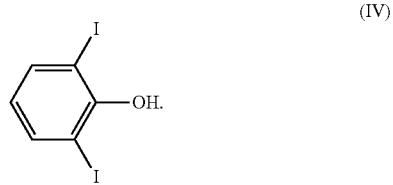

(IV)

311 grams of the primarily bis-iodinated phenol solution (IV) (135 mol) was: mixed with an. excels of 280 grams of epicholorohydrin and subsequently heated to about 80° C. After the heating step, a solution of 53.5 grams sodium hydroxide (1.34 mol) in methanol was slowly added over an hour. After an additional hour of gentle reflux at 80° C. reaction, mixture contained both a solid sod a liquid phase. This mixture was cooled and diluted in methylenechloride/hexane, filtered, and evaporated, resulting in a crude product. The crude product was purified by fractional distillation (boiling point 110-150° C. 0.1 Torr), yielding 265 grams of a water while liquid material having isomers of the glycidyl ether of mono-iodophenol and the glycidyl ether of bis-iodophenol (II);

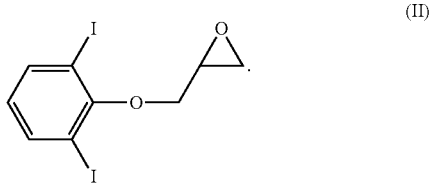 [SMILES: Ic1cccc(I)c1OCC1CO1]

(II)

Elemental analysis: of the product was consistent with Its chemical formula. The product has a refractive Index of 1.6105.

Example 3

X-Ray Opaque Coating Testing

A thermoset epoxy resin formed from an iodinated phenol containing a glycidyl ether was used as an obfuscation layer and was placed relative to an integrated circuit, similar to the cross-sectional illustration of FIG. 1. The integrated circuit and the obfuscation layer were imaged using X-rays.

Specifically, 10 grams of tetraiodobisphenol A (III) was mixed with 1.5 grams of phenylglycidylether to aid processing 0.8 grams of TETA was added and the mixture was heated to 100° C. for 24 hours. Elemental analysis of the resulting material revealed the following composition: C-36.3%, H-3.6%, N-2.5%, and 1-48.9%. The material was opaque to hard and soft X-rays.

For example, FIG. 2 shows an image of a integrated circuit with vias and bonds that, are obscured due to the use of an obfuscation layer containing a cured iodinated bisphenol A epoxy with a bismuth iodide ($BiI_3$) filler. As FIG. 2 shows, the features of the circuit are difficult to distinguish. Similar results have been obtained with other obfuscation layers containing epoxy resins formed from iodinated phenol containing a glycidyl ether.

Although only exemplary embodiments of the invention are specifically described above, it will be appreciated that modifications and variations of these examples are possible without departing from, the spirit and intended scope of the invention. For example, in specification particular measurements are given. It would be understood by one of ordinary skill in the art that in many instances other values similar to (such as about or approximately), but not exactly the same as the given measurements may be equivalent and may also be encompassed by the present invention.

The invention claimed is:

1. An X-ray opaque coating comprising:
   an epoxy resin formed from a diglycidyl ether of tetraiodobisphenol A having a general formula of:

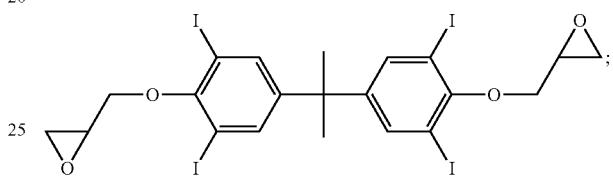

a compound selected from the group consisting of a glycidyl ether of a mono-iodinated phenol, a glycidyl ether of a bis-iodinated phenol, a glycidyl ether of a tri-iodinated phenol, and combinations thereof; and
   an X-ray opaque inorganic filler.

2. The X-ray opaque coating according to claim 1, wherein the glycidyl ether of the bis-iodinated phenol has the general formula:

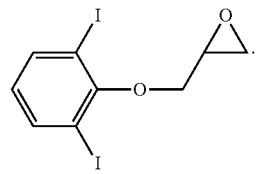

3. The X-ray opaque coating according to claim 1, wherein the coating comprises a mixture of at least two of the mono-iodinated phenol, the bis-iodinated phenol, and the tri-iodinated phenol.

4. The X-ray opaque coating according to claim 3, wherein the mixture comprises more than 50% bis-iodinated phenol.

5. The X-ray opaque coating according to claim 4, wherein the mixture comprises more than 90% bis-iodinated phenol.

6. The X-ray opaque coating according to claim 4, wherein the mixture comprises between 50-90% bis-iodinated phenol.

7. The X-ray opaque coating according to claim 1, wherein the coating comprises up to 85% inorganic filler by weight.

8. The X-ray opaque coating according to claim 1, wherein the filler comprises at least one of potassium iodide, bismuth iodide, barium chloride, barium iodide, barium sulfate, lead, lead iodide, lead acetate, lead oxide, and gold flake.

* * * * *